United States Patent
Takahashi et al.

(10) Patent No.: US 6,946,405 B2
(45) Date of Patent: Sep. 20, 2005

(54) POLYPARAXYLYLENE FILM, PRODUCTION METHOD THEREFOR AND SEMICONDUCTOR DEVICE

(75) Inventors: Akio Takahashi, Tokyo (JP); Yuichi Satsu, Hitachi (JP); Harukazu Nakai, deceased, late of Hitachi (JP); by Yoshiko Nakai, legal representative, Kanazawa (JP); Igor Yefimovich Kardash, Moscow (RU); Andrei Vladimirovich Pebalk, Moscow (RU); Sergei Nicolaevich Chvalun, Moscow (RU); Karen Andranikovich Mailyan, Moscow (RU)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/484,840

(22) PCT Filed: Jul. 22, 2002

(86) PCT No.: PCT/JP02/07389
§ 371 (c)(1),
(2), (4) Date: Aug. 16, 2004

(87) PCT Pub. No.: WO03/011952
PCT Pub. Date: Feb. 13, 2003

(65) Prior Publication Data
US 2005/0014388 A1 Jan. 20, 2005

(30) Foreign Application Priority Data
Jul. 27, 2001 (RU) ........................................ 2001120908

(51) Int. Cl.⁷ .............................................. H01L 21/31
(52) U.S. Cl. .................. 438/780; 438/778; 438/25; 438/26; 257/636; 257/635; 257/637; 428/516; 427/545

(58) Field of Search ................................. 438/780, 778, 438/25, 26; 257/635, 636, 637; 428/516; 427/545

(56) References Cited

U.S. PATENT DOCUMENTS

| | | | | |
|---|---|---|---|---|
| 3,753,773 A | * | 8/1973 | Lee | 428/516 |
| 3,936,531 A | * | 2/1976 | Hofer | 427/545 |
| 4,321,299 A | * | 3/1982 | Frosch et al. | 442/379 |
| 5,268,033 A | * | 12/1993 | Stewart | 118/719 |
| 5,646,440 A | * | 7/1997 | Hasegawa | 257/635 |
| 5,858,457 A | * | 1/1999 | Brinker et al. | 427/162 |
| 5,945,605 A | * | 8/1999 | Julian et al. | 73/727 |
| 5,992,228 A | * | 11/1999 | Dunham | 73/152.05 |
| 6,459,164 B2 | * | 10/2002 | Nagerl et al. | 257/795 |

FOREIGN PATENT DOCUMENTS

WO    WO 00/06307    *    2/2000    ............ B05D/5/00

OTHER PUBLICATIONS

Buhler, Heat Resistant and Thermal Stable Polymer, Moscow Chemistry, 1984, (Russian Translation of Buhler, 1973, Academic Press, Berlin).

Lee, et al., New Linear Polymers, McGraw-Hill Book Company, 1967, pp. 74–76, New York.

* cited by examiner

Primary Examiner—David Zarneke
Assistant Examiner—Victor V. Yevsikov
(74) Attorney, Agent, or Firm—Crowell & Moring LLP

(57) ABSTRACT

An organic polymer film of low dielectric constant and high heating resistance which is applicable as an insulating layer of a semiconductor devices is provided, as well as a manufacturing method for the film and a semiconductor device incorporating the film.

16 Claims, 3 Drawing Sheets

POLYPARAXYLYLENE FILM, PRODUCTION METHOD THEREFOR AND SEMICONDUCTOR DEVICE

BACKGROUND OF THE INVENTION

This invention relates to films which have been widely used in electronic and electric fields, and particularly to poly-paraxylylene useful as an insulating layer of low dielectric constant and high heating resistance between wiring layers, manufacturing method thereof, and semiconductor device using thereof.

The film of this invention means both a freestanding film and a coating film bonded to a substrate, for example an insulating film between wiring layers.

With the development of high-density integration of semiconductor integrated circuits, their wiring line and space have been greatly reduced. As a result, line-to-line parasitic capacitances have become greater and affected the operation speeds of the semiconductor integrated circuits. Various suggestions have been made to solve this problem. One of such suggestions is to use a poly-paraxylylene film of a low dielectric constant as the wiring insulating film.

For example, a poly-paraxylylene film is prepared by subliming 2,2-paracyclophane, which is a cyclophane compound, at 250° C., pyrolyzing the resulting product into the intermediate of paraxylylene at 600° C., polymerizing the intermediate at a maximum of 30° C. in a polymerization tank, and depositing the resulting polymer on a substrate. (K.-U. Buhler, "Heat resistant and thermostable polymers," Moscow, "Chemistry," pp. 166–167, 1984.)

Another method of manufacturing poly-paraxylylene, its derivative file, and membrane is disclosed (H. Lee, D. Stoffey, K. Neville, "New Linear Polymers," Moscow, "Chemistry," pp. 74–76, 1972). This method comprises the steps of pyrolyzing cyclic poly-paraxylylene dimer (2,2-paracyclophane) and its derivative under a reduced pressure into reactive intermediates, polymerizing and depositing thereof onto substrate surfaces. The pyrolyzing process is carried out in a pyrolyzing tube connected to a polymerizing and depositing chamber. The process further comprises the steps of placing a preset quantity of cyclic poly-paraxylylene dimer or its derivative in a sublimation zone, hermetically closing the container, and reducing the pressure of the container down to 1 to 100 mmHg. Cyclic poly-paraxylylene dimer sublimes at a rate of about 0.25 to 0.35 grams/minute and moves into the sublimation zone. The sublimation zone is kept at 140 to 220° C., although the desired temperature depends upon the monomers used as raw material. The pyrolysis zone is kept at about 600° C. and the decomposed gases are fed to the polymerization chamber which is kept at a room temperature. For some monomer materials, the polymerization chamber is heated up to 160° C. during polymerization.

FIG. 1 shows an example of a manufacturing method for a semiconductor device which uses poly-paraxylylene for the insulating layer. (Japanese Application Patent Laid-open Publication Nos. Hei 09-317499 and Hei 09-345669) A method of producing a semiconductor device having multiple wiring layers comprises the processes of forming a first aluminum wiring 14 on a semiconductor substrate 13, forming an organic polymer layer 15 over the semiconductor device having the aluminum wiring 14 thereon by the above method (Process "a"), forming a silicon oxide layer 16 over the organic polymer layer by a chemical vapor-phase growth (Process "b"), grinding the silicon oxide layer 16 by a chemical machine grinding method (Process "c"), forming via-holes in the layer 15 with tungsten 17, forming a second aluminum wiring on the ground layer 16 (Process "d"), and repeating these processes (a) to (d).

Another process to manufacture multi-layer membranes and films of poly-paraxylylene is provided in U.S. Pat. No. 1,151,546 (1985). This process comprises the steps of pyrolyzing cyclic poly-paraxylylene dimer at 450 to 700° C. under a reduced pressure of 1 to 100 mmHg, depositing the product of decomposition on a substrate at about 15 to 25° C., and polymerizing thereof. Reducing the dielectric constant is desirable for the insulating film of semiconductor devices. Insulating materials having specific inductive capacity of 2.5 or less have been wanted.

MACROMOLECULES 1999,32, 7555–7561 discloses an organic polymer film of a low specific inductive capacity of 2.3 and excellent heat resistance prepared by subliming 1,1,2,2,9,9,10,10-octafluoro-2,2-cyclophane at 70 to 100° C. at a vacuum pressure, pyrolyzing thereof at 650° C., and depositing the resulting polymer onto a cool substrate.

SUMMARY OF THE INVENTION

An object of this invention is to provide an organic polymer film of low dielectric constant and high heating resistance which is applicable as an insulating layer for semiconductor devices. Additional objects include a manufacturing method for such organic polymer films, and a semiconductor device using such films.

These and other objects and advantages of the invention are achieved by a porous poly-paraxylylene film prepared by the processes of subliming paraxylylene or its derivative cyclic dimer, pyrolyzing the resulting product at 800 to 950° C., and polymerizing the product obtained by pyrolysis. Said poly-paraxylylene film should preferably contain a porous structure of 10 to 50% by volume.

In an embodiment, the invention also provides a method of manufacturing porous poly-paraxylylene films comprising the processes of subliming paraxylylene or its derivative cyclic dimer at 30 to 160° C., pyrolyzing the resulting product at 800 to 950° C., polymerizing the product obtained by pyrolysis at −40 to +25° C., and heat-treating the resulting polymer. It is preferable that each of the sublimation, pyrolysis, and polymerization processes is kept at a vacuum pressure of 0.001 to 0.1 mmHg. Further, it is preferable that the heat-treating process alternately comprises heating to increase the temperature and heating to maintain the temperature in a stepwise manner, that the final heating is made at 390 to 410° C., and that the heat-treating process is kept at a vacuum pressure of 0.001 to 0.1 mmHg.

Furthermore, it is preferable that the heat-treating process comprises a first step of heating up to 200° C. at a maximum rate of 4° C./minute, a second step of heating for at least 35 minutes to maintain the temperature at 170 to 220° C., a third step of heating up to 380° C. at a maximum rate of 0.5° C./minute, a fourth step of heating for at least 70 minutes at 350 to 390° C., a fifth step of heating up to 390 to 410° C. at a maximum rate of 0.5° C./minute, and a sixth step of heating for at least 70 minutes at 390 to 410° C.

In still another embodiment, the invention provides a porous poly-paraxylylene and its derivative film prepared by the processes of subliming paraxylylene or its derivative cyclic dimer at 30 to 160° C., pyrolyzing the resulting product at 800 to 950° C., polymerizing the product obtained by pyrolysis at −40 to +25° C., and heat-treating the resulting polymer, wherein the polymer is taken out from the polymerization tank and heat-treated by any of methods stated above after said polymerization process.

A semiconductor device whose semiconductor elements are electrically connected to thin-film wirings formed on an insulating film, wherein said insulating film is a porous poly-paraxylylene film prepared by the processes of subliming paraxylylene or its derivative cyclic dimer, pyrolyzing the resulting product at 800 to 950° C., and polymerizing the product obtained by pyrolysis.

Said insulating film should preferably be fluorinated poly-paraxylylene prepared by subliming a cyclophane compound which contains fluorine atoms, pyrolyzing the sublimed compound into paraxylylene monomer at 800 to 950° C., polymerizing said paraxylylene monomer into poly-paraxylylene precipitate, and heat-treating thereof It is preferable that the heat-treating process performs heating to alternately increase the temperature and maintain the temperature in a stepwise manner, with the final heating step made at 390 to 410° C.

In another embodiment, the invention provides a semiconductor device wherein said insulating film is a poly-paraxylylene film containing a porous structure therein which is prepared by a process of subliming a cyclophane compound at 30 to 160° C. under reduced pressure of 0.001 to 0.1 mmHg, a process of pyrolyzing said product of sublimation into paraxylylene monomer at 800 to 950° C., and a process of polymerizing said paraxylylene monomer on a substrate at −40 to +25° C.

In still another embodiment, the invention provides a semiconductor device whose semiconductor elements are electrically connected to thin-film wirings formed on an insulating film, wherein said insulating film is a porous poly-paraxylylene film prepared by the processes of subliming paraxylylene or its derivative cyclic dimer at 30 to 160° C., pyrolyzing the resulting product at 800 to 950° C., polymerizing the product obtained by pyrolysis at −40 to +25° C., and heat-treating the obtained polymer.

The poly-paraxylylene film should preferably contain a porous structure of 25 to 50% by volume.

In yet another embodiment, the invention provides a multi-layer wiring substrate which laminates wiring layers having a conductive circuit on at least one side of an insulating base with an insulating layer therebetween, wherein at least one of said insulating base or said insulating layer is a poly-paraxylylene film containing a porous structure in said insulating layer, which is prepared by subliming paraxylylene or its derivative cyclic dimer at 30 to 160° C., pyrolyzing the resulting product at 800 to 950° C., polymerizing the product obtained by pyrolysis at −40 to +25° C., and heat-treating the obtained polymer.

DETAILED DESCRIPTION OF THE INVENTION

Figure 1:
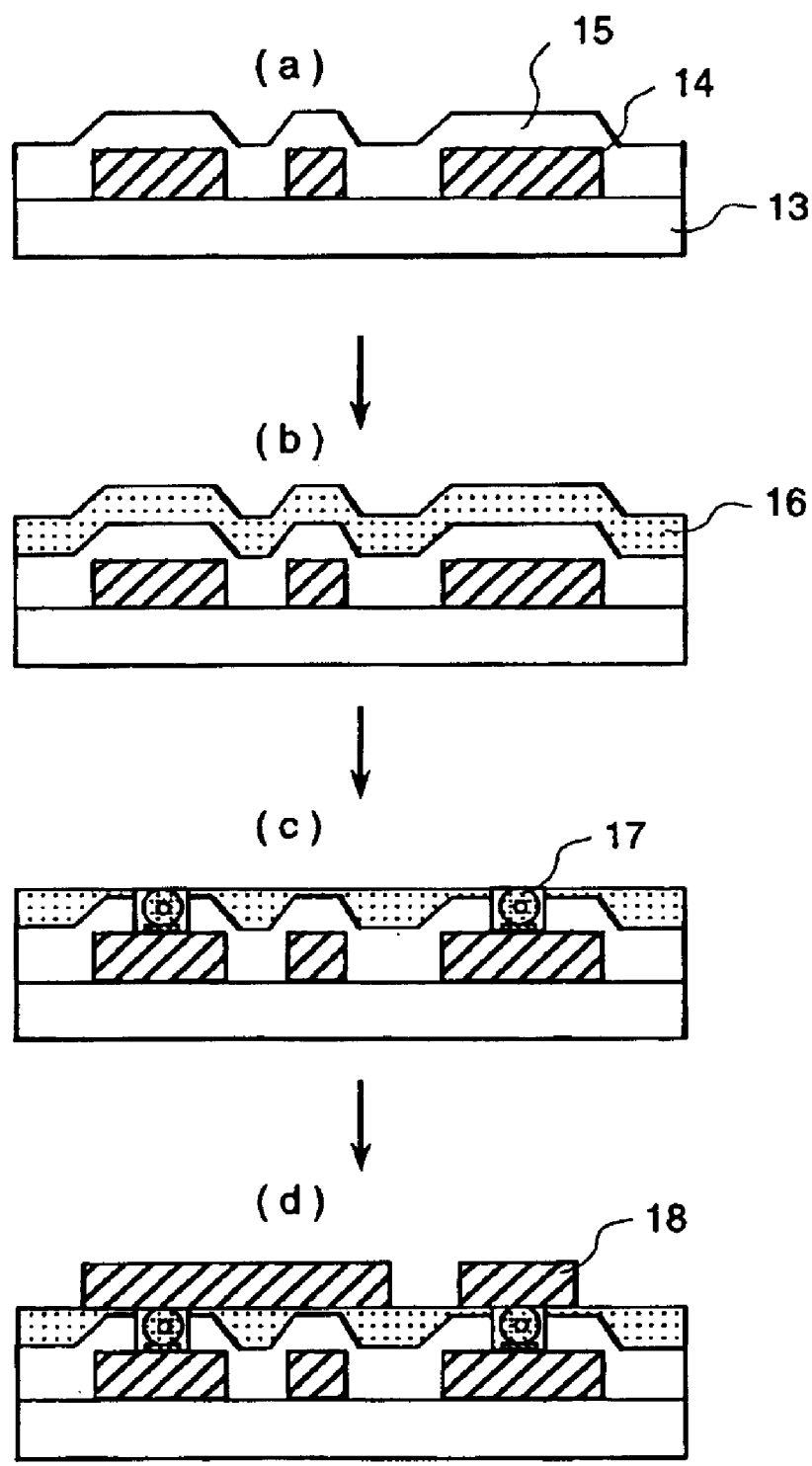
FIG. 1 shows sectional views of manufacturing processes of a semiconductor device in accordance with the present invention.

A poly-paraxylylene film of this invention can be prepared by the processes of subliming a cyclophane compound containing fluorine atoms such as 2,2-paracyclophane, 1,1,2,2,9,9,10,10-octafluoro-2,2-cyclophane, and 4,5,7,8,12,13,15,16-octafluoro-2,2-paracyclophane, pyrolyzing the product of sublimation at 800 to 950° C., and polymerizing the resulting product of pyrolysis.

Referring to FIG. 2, below will be explained a method for forming a poly-paraxylylene insulating film from poly-paraxylylene or its derivative cyclic dimer. First, 2,2-paracyclophane 7 which is dimer (cyclic dimer) is sublimed at 120° C. in the sublimation zone 1. Before pyrolysis, the chamber is kept at a vacuum pressure of 0.05 mmHg.

Next, the product of sublimation is pyrolyzed into monomer 8 at 800 to 950° C. in the pyrolyzation zone 3. Finally, the monomer is polymerized and deposited to form an insulating layer of poly-paraxylylene 9 on a substrate 4 at 20° C. in the polymerization zone 6.

This invention prefers 1,1,2,2,9,9,10,10-octafluoro-2,2-cyclophane (dimer) as it is pyrolyzed into monomer efficiently.

When sublimated and pyrolyzed at 820 to 950° C., 1,1,2,2,9,9,10,10-octafluoro-2,2-cyclophane as cyclic dimer of paraxylylene or its derivative generates $\alpha,\alpha,\alpha',\alpha'$-tetrafluoro-paraxylylene intermediate. The intermediate can be vapor-phase-polymerized into a poly-paraxylylene film containing a porous structure of 25 to 50% by volume therein. In an embodiment, the pyrolyzing temperature is set to 800° C. to 950° C.

It is possible to prepare a low-dielectric-constant and high-heat-resistance film containing a porous structure by employing an additional process of alternately performing heating to increase the temperature and heating to maintain the temperature in a stepwise manner, and finally heat-treating at 390 to 410° C.

If the pyrolyzing temperature is below 800° C., the dimer is insufficiently pyrolyzed into monomer. Consequently, the resulting porous structure is incomplete in the final film. Additionally, the specific inductive capacity and the heat resistance of the final poly-paraxylylene product are far from what are expected. Further, when the pyrolyzing temperature goes over 950° C., monomer pyrolyzed from dimer is further decomposed into by-products that may deteriorate the heat resistance of poly-paraxylylene. In other words, the by-products contain a lot of ingredients that are volatile at 250 to 400° C. These by-products cannot be removed even when a formed film is heat-treated at 400° C.

For preparation of a poly-paraxylylene film containing an optimum porous structure, it is preferable to sublime at 30 to 160° C. under reduced pressure of 0.001 to 0.1 mmHg and polymerize at −40 to +25° C. Further, it is preferable to add a process of alternately performing heating to increase the temperature and heating to maintain the temperature in a stepwise manner, with a final heating step at 390 to 410° C.

This heat treatment can be done in the presence of air but the stepwise heating condition is dependent upon the atmosphere.

The heat treatment in a vacuum pressure of 0.1 mmHg or higher should preferably comprise a first step of heating up to 170 to 220° C. at a maximum rate of 4° C./minute, a second step of heating for at least 30 minutes to maintain the temperature, a third step of heating up to 350 to 390° C. at a maximum rate of 0.5° C./minute, a fourth step of heating for at least 60 minutes to keep the temperature in this range, a fifth step of heating up to 390 to 410° C. at a maximum rate of 0.5° C./minute, and a sixth step of heating for at least 60 minutes at 390 to 410° C.

More preferably, the heat-treatment should comprise a first step of heating up to 190 to 210° C. at a maximum rate of 4° C./minute, a second step of heating for at least 30 minutes to keep the temperature, a third step of heating up to 370 to 380° C. at a maximum rate of 0.5° C./minute, a fourth step of heating for at least 60 minutes to keep the temperature in this range, a fifth step of heating up to 390 to 410° C. at a maximum rate of 0.5° C./minute, and a sixth step of heating for at least 60 minutes to keep the temperature in this range.

Poly-paraxylylene of this invention is a film contains both crystal and amorphous structures and the crystal structure makes a phase transition in the temperature ranges of 170 to 220° C. and 350 to 410° C. In this invention, it is preferable to eliminate low molecular weight components which exist in this phase transition temperature or its vicinity and impurities produced by pyrolysis.

In the present invention, the quantity which is lost by heating was measured by Mettler TA-300 (manufactured by Mettler Co.) and processed its data by Solaris operating system (software).

The present invention will be described in further detail by way of embodiments.

Embodiment 1.

1,1,2,2,9,9,10,10-octafluoro-2,2-paracyclophane as cyclic dimer of paraxylylene (10 in FIG. 2) or its derivative was placed in a crucible furnace in a chamber under a reduced pressure of 0.005 mmHg or higher.

the crucible furnace was heated up to 60° C. to sublime 1,2,2,9,9,10,10-octafluoro-2,2-paracyclophane and moved the sublimation gas from the sublimation zone to the pyrolysis zone. In the pyrolysis zone, the sublimation gas was pyrolyzed into high-active $\alpha,\alpha,\alpha',\alpha'$-tetrafluoro-paraxylylene intermediate 11 at 900° C. This high reactive intermediate was polymerized and deposited on a 50 mm-diameter circular glass plate which was kept at −10° C. in the polymerization zone.

A 35 μm-thick film of poly-$\alpha,\alpha,\alpha',\alpha'$-tetrafluoro-paraxylylene 12 was obtained.

The pressure of the chamber was returned to the ordinary pressure, the film was put from the glass disk, put the film in a glass ampule, and the ampule was evacuated down to 0.005 mmHg.

Figure 2A:
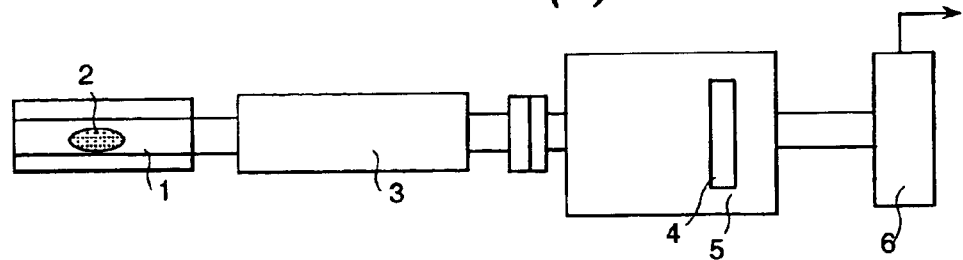
FIG. 2 shows an outlined manufacturing process of poly-paraxylylene in accordance with the present invention.
Figure 2A:
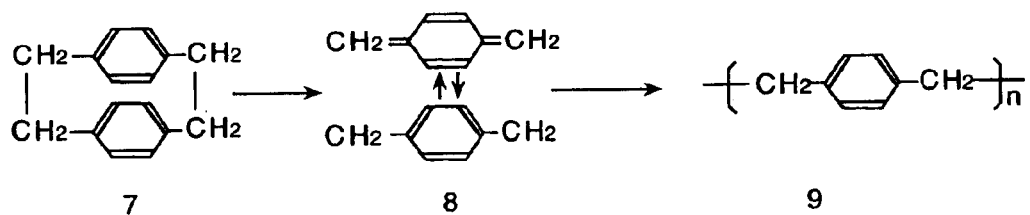
Figure 2A:
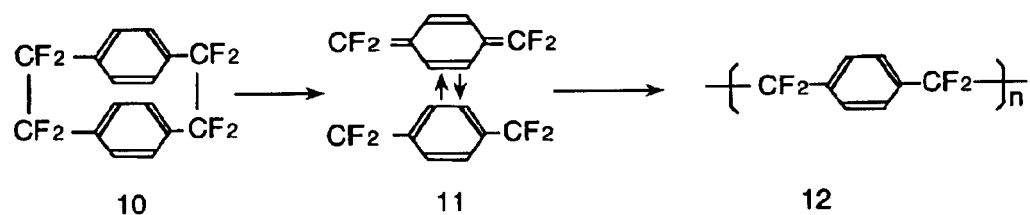
Figure 2B:
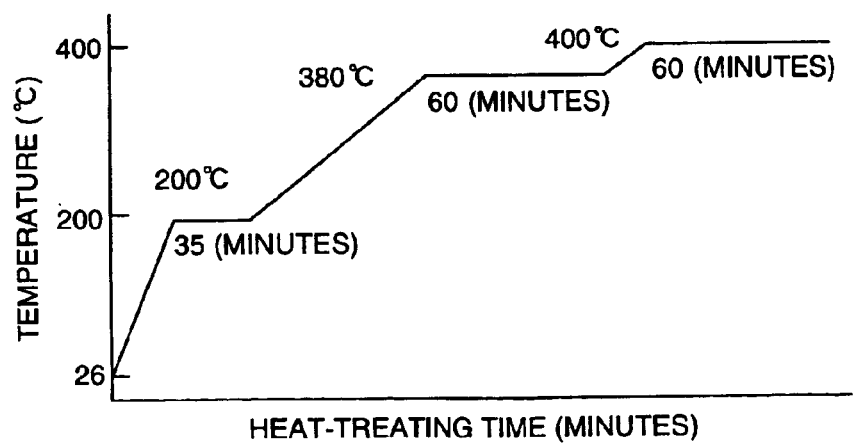

Then the film was heat-treated in the ampule according to the heat-treatment program of FIG. 2(b): heating up to 200° C. at a rate of 4° C./minute, heating for 35 minutes at 200° C., heating up to 380° C. at a rate of 0.5° C./minute, heating for 70 minutes to keep at 380° C., heating up to 400° C. at a rate of 0.5° C./minute, and heating for 70 minutes to keep at 400° C. With this, an organic polymer film was obtained containing a porous structure.

The final film has lost its weight by 30% in comparison with its initial weight.

The final film has a density of 1.13 g/cm$^3$, a specific inductive capacity of 1.84 (at 1 MHz), and a dielectric dissipation factor of 0.001 or less.

Embodiment 2.

1,1,2,2,9,9,10,10-octafluoro-2,2-paracyclophane, which is similar to that of Embodiment 1, was put in a crucible furnace in a chamber under a reduced pressure of 0.005 mmHg or higher. The crucible furnace was heated up to 60° C. to sublime 1,2,2,9,9,10,10-octafluoro-2,2-paracyclophane and the sublimation gas was moved from the sublimation zone to the pyrolysis zone. In the pyrolysis zone, the sublimation gas was pyrolyzed into high-active $\alpha,\alpha,\alpha',\alpha'$-tetrafluoro-paraxylylene intermediate at 910° C.

This high reactive intermediate was then deposited on a 100 mm diameter silicon wafer which is kept at −15° C. in the polymerization zone. A 10 μm-thick film of poly-$\alpha,\alpha,\alpha',\alpha'$-tetrafluoro-paraxylylene was obtained.

The pressure of the chamber was returned to the ordinary pressure, the silicon wafer covered with the film was placed in a vacuum heating furnace and reduced the pressure was reduced down to 0.005 mmHg.

The film was then heat-treated in the furnace in the order below: heating up to 200° C. at a rate of 4° C./minute, heating for 40 minutes at 200° C., heating up to 380° C. at a rate of 0.5° C./minute, heating for 90 minutes to keep at 380° C., heating up to 400° C. at a rate of 0.5° C./minute, and heating for 90 minutes to keep at 400° C. With this, an organic polymer film containing a porous structure was obtained.

The final film has lost its weight by 32% in comparison with its initial weight. The final film has a specific inductive capacity of 1.82 (at 1 MHz), and a dielectric dissipation factor of less than 0.001.

Embodiment 3.

Dichoro-2,2-paracyclophane as cyclic dimer of paraxylylene or its derivative was put in a crucible furnace in a chamber under a reduced pressure of 0.005 mmHg or higher. The crucible furnace was heated up to 120° C. to sublime dichloro-2,2-paracyclophane and moved the sublimation gas from the sublimation zone to the pyrolysis zone. In the pyrolysis zone, the sublimation gas was pyrolyzed into high-active chloro-paraxylylene intermediate at 820° C.

The high reactive intermediate was polymerized and deposited on a 50 mm-diameter circular glass plate which is kept at 25° C. in the polymerization zone. A 25 μm-thick film of poly-chloro-paraxylylene was obtained.

The pressure of the chamber was returned to the ordinary pressure, the film was removed from the glass disk, the film put in a glass ampule, and the ampule was evacuated down to 0.005 mmHg. The film was then heat-treated in the ampule in the following order: heating up to 200° C. at a rate of 3.5° C./minute, heating for 40 minutes at 200° C., heating up to 380° C. at a rate of 0.4° C./minute, heating for 75 minutes to maintain the temperature at 380° C., heating up to 400° C. at a rate of 0.4° C./minute, and heating for 75 minutes to maintain the temperature at 400° C. With this, an organic polymer film containing a porous structure was obtained.

The final film has lost 35% by weight in comparison with its initial weight. The final film has a density of 0.84 g/cm$^3$, a specific inductive capacity of 2.40 (at 1 MHz), and a dielectric dissipation factor of 0.001 or less.

Embodiment 4.

2,2-paracyclophane (7 of FIG. 2) as cyclic dimer of paraxylylene or its derivative was put in a crucible furnace in a chamber under a reduced pressure of 0.005 mmHg or higher. The crucible furnace was heated up to 160° C. to sublime 2,2-paracyclophane and the sublimation gas was moved from the sublimation zone to the pyrolysis zone. In the pyrolysis zone, the sublimation gas was pyrolyzed into high-active paraxylylene intermediate (8 of FIG. 2) at 950° C.

The high reactive intermediate was then polymerized and deposited on a 50 mm-diameter circular glass plate which is kept at 25° C. in the polymerization zone. A 15 μm-thick organic polymer film of poly-paraxylylene (9 of FIG. 2) and its derivative was obtained.

The pressure of the chamber was returned to the ordinary pressure, the film was removed from the glass disk and put in a glass ampule, and the ampule was evacuated down to 0.005 mmHg.

The film was then heat-treated in the ampule in the following order: heating up to 200° C. at a rate of 3.5° C./minute, heating for 40 minutes at 200° C., heating up to 380° C. at a rate of 0.45° C./minute, heating for 70 minutes to maintain the temperature at 380° C., heating up to 400° C. at a rate of 0.45° C./minute, and heating for 70 minutes to maintain the temperature at 400° C. With this, an organic polymer film containing a porous structure was obtained.

The final film has lost 40% by weight in comparison with its initial weight. The final film has a density of 0.67 g/cm$^3$, a specific inductive capacity of 2.0 (at 1 MHz), and a dielectric dissipation factor of 0.0006 or less.

COMPARATIVE EXAMPLE 1

1,1,2,2,9,9,10,10-octafluoro-2,2-paracyclophane, which is dimer similar to that of Embodiment 1, was put in a crucible furnace in a chamber under a reduced pressure of 0.005 mmHg or higher. The crucible furnace was heated up to 90° C. to sublime 1,2,2,9,9,10,10-octafluoro-2,2-paracyclophane and the sublimation gas was moved from the sublimation zone to the pyrolysis zone. In the pyrolysis zone, the sublimation gas was pyrolyzed into a by-product containing α,α,α',α'-tetrafluoro-paraxylylene intermediate at 730° C.

The by-product containing the intermediate was deposited on a 50 mm-diameter circular glass plate which is kept at −10° C. in the polymerization zone. A 35 μm-thick film of poly-α,α,α',α'-tetrafluoro-paraxylylene was obtained.

The pressure of the chamber was returned to the ordinary pressure, the film was removed from the glass disk and put in a glass ampule, and the ampule was evacuated down to 0.005 mmHg. The film was then heat-treated in the ampule by heating it up to 400° C. at a rate of 5° C./minute and heating for 70 minutes to maintain the temperature at 400° C.

The final film has lost 6% by weight in comparison with its initial weight. The final film has a density of 1.58 g/cm$^3$ which is the initial density, a specific inductive capacity of 2.34 (at 1 MHz), and a dielectric dissipation factor of 0.001 or less.

COMPARATIVE EXAMPLE 2

1,1,2,2,9,9,10,10-octafluoro-2,2-paracyclophane, which is dimer similar to that of Embodiment 1, was put in a crucible furnace in a chamber under a reduced pressure of 0.005 mmHg or higher. The crucible furnace was heated up to 100° C. to sublime 1,2,2,9,9,10,10-octafluoro-2,2-paracyclophane and the sublimation gas was moved from the sublimation zone to the pyrolysis zone. In the pyrolysis zone, the sublimation gas was pyrolyzed into a by-product containing high reactive α,α,α',α'-tetrafluoro-paraxylylene intermediate at 650° C.

The by-product containing the high reactive intermediate was deposited on a 100 mm-diameter silicon wafer which is kept at −15° C. in the polymerization zone. A 10 μm-thick film containing poly-α,α,α',α'-tetrafluoro-paraxylylene was obtained.

The pressure of the chamber was returned to the ordinary pressure, the silicon wafer covered with the film was put in a vacuum heating furnace and the pressure was reduced down to 0.005 mmHg. The silicon wafer was heat-treated by heating it up to 400° C. at a rate of 50° C./minute and heating for 90 minutes to maintain the temperature at 400° C.

The final film has lost 8% by weight in comparison with its initial weight. The final film has a specific inductive capacity of 2.4 (at 1 MHz) and a dielectric dissipation factor of 0.001 or less, which are the same as those before heat-treatment.

COMPARATIVE EXAMPLE 3

Dichloro-2,2-paracyclophane, which is a raw material of polychloro-paraxylylene, was put in a crucible furnace in a chamber under a reduced pressure of 0.005 mmHg or higher. The crucible furnace was heated up to 110° C. to sublime dichloro-2,2-paracyclophane and the sublimation gas was moved from the sublimation zone to the pyrolysis zone. In the pyrolysis zone, the sublimation gas was pyrolyzed into a high reactive chloro-paraxylylene intermediate at 650° C.

The high reactive intermediate was deposited on a 50 mm diameter circular glass plate which is kept at 25° C. in the polymerization zone. A 25 μm-thick film of poly-chloro-paraxylylene was obtained.

The pressure of the chamber was returned to the ordinary pressure, the film was removed from the glass disk and put in a glass ampule, and the ampule was evacuated down to 0.005 mmHg. The film was then heat-treated in the ampule by heating it up to 400° C. at a rate of 5° C./minute and heating for 75 minutes to maintain the temperature at 400° C.

The final film has lost 10% by weight in comparison with its initial weight. The final film has a density of 1.29 g/cm$^3$, a specific inductive capacity of 2.95 (at 1 MHz), and a dielectric dissipation factor of 0.013 or less.

COMPARATIVE EXAMPLE 4

2,2-paracyclophane was put in a crucible furnace in a chamber under a reduced pressure of 0.005 mmHg or higher. The crucible furnace was heated up to 120° C. to sublime 2,2-paracyclophane and the sublimation gas was moved from the sublimation zone to the pyrolysis zone. In the pyrolysis zone, the sublimation gas was pyrolyzed into a high reactive paraxylylene intermediate at 650° C. The high reactive intermediate was then deposited on a 50 mm-diameter circular glass plate which is maintained at 25° C. in the polymerization zone. A 15 μm-thick film of poly-paraxylylene was maintained.

The pressure of the chamber was returned to the ordinary pressure, the film was removed from the glass disk and put in a glass ampule, and the ampule was evacuated down to 0.005 mmHg. The film in the ampule was heat-treated by heating it up to 400° C. at a rate of 5° C./minute and heating for 70 minutes to maintain the temperature at 400° C.

The final film has lost 10% by weight in comparison with its initial weight. The final film has a density of 1.11 g/cm$^3$, a specific inductive capacity of 2.70 (at 1 MHz), and a dielectric dissipation factor of 0.006 or less which are the same as those before heat-treatment.

Embodiment 5.

FIG. 1 shows sectional views of manufacturing processes of a semiconductor device in accordance with the present invention.

A semiconductor device having multi-layer wirings was prepared by a method comprising the steps of forming a first aluminum wiring 14 on a semiconductor substrate 13, forming an organic polymer layer 15 of α,α,α',α'-tetrafluoro-paraxylylene and its derivative on the aluminum wiring 14 (Step "a") in which the film is formed and heat-treated under the same conditions of Embodiment 2, forming a silicon oxide layer 16 over the above layer by a chemical vapor-phase growth at 400° C. (Step "b"), grinding the silicon oxide layer 16 by a chemical machine grinding method and forming via-holes in the layer 15 with tungsten 17 (Step "c"), forming a second aluminum wiring 18 thereon (Step "d"), and repeating these steps (a) to (d).

This organic polymer film has a specific inductive capacity of 1.82 and thus enables reduction of the line-to-line parasitic capacitances. Accordingly, this invention can accomplish a semiconductor device of fast signal transmission and high reliability.

Embodiment 6.

Figure 3:
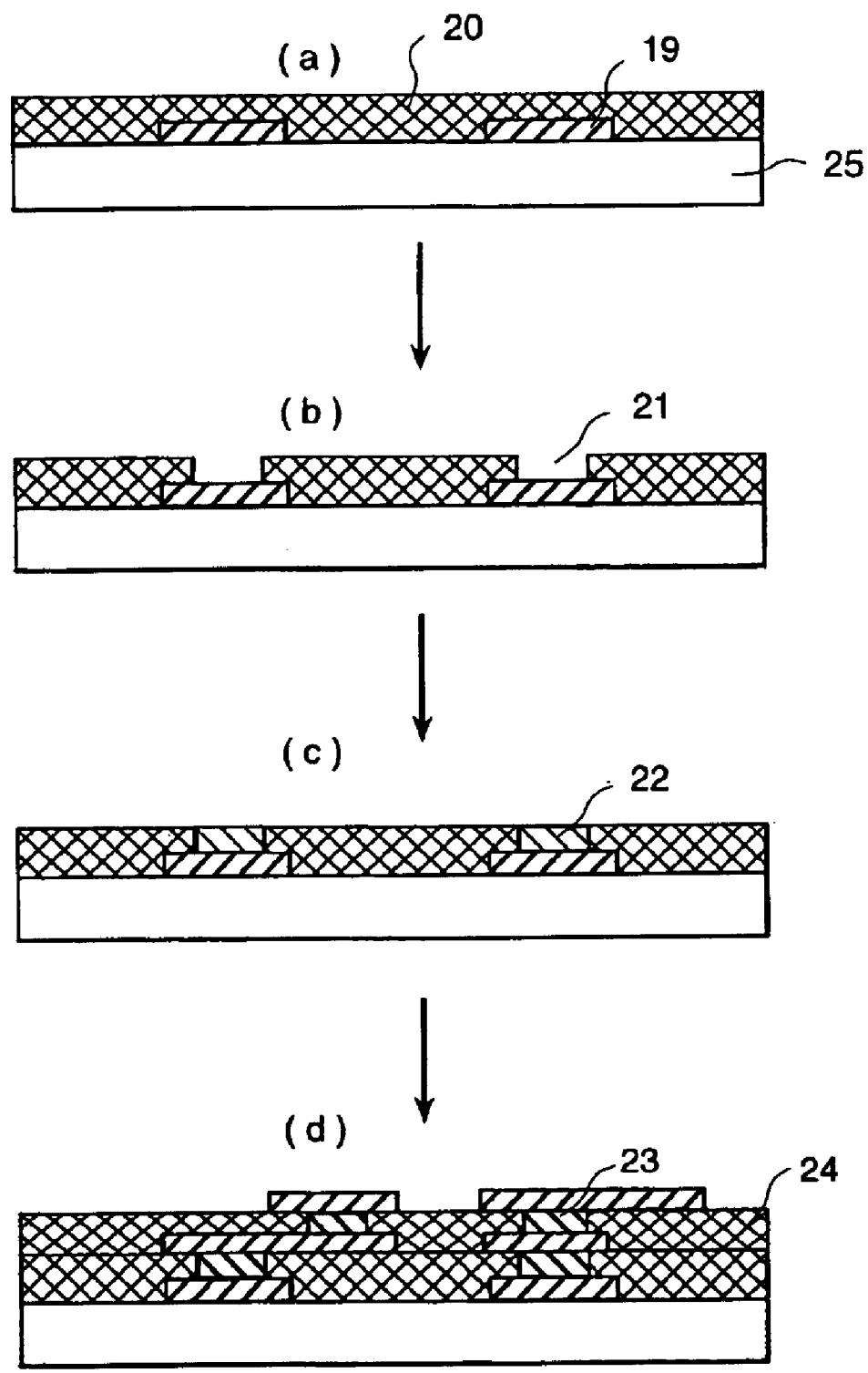
FIG. 3 shows sectional views of manufacturing processes of a multiplayer wiring substrate of the present invention.

FIG. 3 shows sectional views of manufacturing processes of a multiplayer wiring substrate of the present invention.

Process (a): Forming a chromium layer of 0.5 μm thick on a glass ceramic substrate 25 by spattering, forming a copper layer of 0.5 μm thick on the chromium layer by spattering, placing another chromium layer of 5 μm thick on the copper layer, placing a light-sensitive layer on the chromium layer, etching off non-wiring areas of the light-sensitive layer to expose copper wirings 19, placing a porous insulating layer 20 of 15 μm thick on the above layer by a method of Embodiment 3, and grinding the insulating layer by 5 μm to make the surface flat.

Process (b): Making via-holes 21 of 10 μm in diameter by excimer laser processing.

Process (c): Filling the via-holes 21 with spattered copper 22 to make them conductive.

Process (d): Forming a chromium layer of 0.51 μm thick by spattering, forming a copper layer of 0.5 μm thick on the chromium layer by spattering, placing another chromium layer of 0.51 μm thick on the copper layer, placing a light-sensitive layer on the chromium layer, etching off non-wiring areas of the light-sensitive layer to expose the second copper wirings 23, repeating the above processes to form another porous insulating layer 24 and via-holes. The above processes were repeated to form three wiring layers. The dielectric constant of this multi-wiring insulating layer is 2.4. Accordingly, this invention can provide a multi-layer wiring substrate of fast signal transmission characteristics.

Although the present invention has been illustrated and described with respect to exemplary embodiments thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A film of porous poly-paraxylylene or a derivative thereof prepared by the process comprising:
   subliming paraxylylene or a derivative cyclic dimer;
   pyrolyzing the resulting product;
   polymerizing the product obtained by pyrolysis; and
   heat-treating the resulting polymer,
   wherein said film contains a porous structure of 10 to 50% by volume.

2. A film of porous poly-paraxylylene or a derivative thereof in accordance with claim 1, wherein the pyrolyzing step is conducted at 800 to 950° C.

3. A method of manufacturing a film of porous poly-paraxylylene or a derivative thereof, comprising:
   subliming paraxylylene or a derivative cyclic dimer at 30 to 160° C.;
   pyrolyzing the resulting product at 800 to 950° C.;
   polymerizing the product obtained by pyrolysis at −40 to +25° C.; and
   heat-treating the resulting polymer at a temperature of at least 170° C.

4. The method of manufacturing a film poly-paraxylylene or a derivative thereof in accordance with claim 3, wherein said sublimation, pyrolysis, and polymerization processes are performed at a vacuum pressure of 0.001 to 0.1 mmHg.

5. The method of manufacturing a film of poly-paraxylylene or a derivative thereof in accordance with claim 3, wherein the heat-treating process comprises alternately heating to increase the temperature and heating to maintain the temperature in a stepwise manner, wherein a final heating is made at 390 to 410° C.

6. The method of manufacturing a film of poly-paraxylylene or a derivative thereof in accordance with claim 3, wherein the heat-treating process is performed at a vacuum pressure of 0.001 to 0.1 mmHg or in an inactive gas atmosphere.

7. The method of manufacturing a film of poly-paraxylylene or a derivative thereof in accordance with claim 3, wherein the heat-treating process comprises heating to increase the temperature to 170 to 220° C. at a heating rate of 4° C./minute or less, heating to maintain the temperature for at least 35 minutes at 170 to 220° C., heating to increase the temperature to 350 to 390° C. at a rate of 0.5° C./minute or less, heating to maintain the temperature for at least 70 minutes at 350 to 390° C., heating to increase the temperature to 390 to 410° C. at a rate of 0.5° C./minute or less, and heating to maintain the temperature for at least 70 minutes at 390 to 410° C.

8. The method of manufacturing a film of poly-paraxylylene or a derivative film thereof in accordance with claim 7, wherein the heat-treating process comprises heating to increase the temperature to 190 to 210° C. at a rate of 40° C./minute or less, heating to maintain the temperature for at least 35 minutes at 190 to 210° C., heating to increase the temperature to 370 to 380° C. at a rate of 0.5° C./minute or less, heating to maintain the temperature for at least 70 minutes at 370 to 380° C., heating to increase the temperature to 390 to 410° C. at a rate of 0.5° C./minute or less, and heating to maintain the temperature for at least 70 minutes at 390 to 410° C.

9. A semiconductor device whose semiconductor elements are electrically connected to thin-film wirings formed on an insulating film, wherein said insulating film is a poly-paraxylylene and its derivative film which is prepared by the method of claim 3 and contains a porous structure therein.

10. A semiconductor device in accordance with claim 9, wherein said film contains a porous structure of 25 to 50% by volume.

11. A multi-layer wiring substrate comprising laminate wiring layers having a conductive circuit on at least one side of an insulating base with an insulating layer therebetween, wherein at least one of said insulating base and said insulating layer is a film of poly-paraxylylene or a derivative thereof which is prepared by the method of claim 3 and contains a porous structure therein.

12. A film of porous poly-paraxylylene or a derivative thereof prepared by the process comprising:
   subliming paraxylylene or a derivative cyclic dimer at 30 to 160° C.;
   pyrolyzing the resulting product at 800 to 950° C.;
   polymerizing the product obtained by pyrolysis at −40 to +25° C.; and heat-treating the resulting polymer at a temperature of at least 170° C., wherein the polymer is removed from a polymerization tank and heat-treated after said polymerization process.

13. A semiconductor device comprising semiconductor elements electrically connected to thin-film wirings formed on an insulating film, wherein said insulating film comprises porous poly-paraxylylene or a derivative thereof prepared by subliming paraxylylene or a derivative cyclic dimer, pyrolyzing the resulting product at 800 to 950° C., polymerizing the product obtained by pyrolysis, and heat-treating the resulting polymer at a temperature of at least 170° C.

14. A semiconductor device in accordance with claim 13, wherein said insulating film comprises a fluorinated poly-paraxylylene film prepared by subliming a paraxylylene compound, pyrolyzing said compound into paraxylylene monomer at 800 to 950° C., polymerizing said paraxylylene monomer into poly-paraxylylene precipitate, and heat-treating the precipitate.

15. A semiconductor device in accordance with claim 13, wherein said heat-treating comprises alternately heating to increase the temperature and heating to maintain the temperature in a stepwise manner, wherein a final heating is made at 390 to 410° C.

16. A semiconductor device in accordance with claim 13, wherein said insulating film is prepared by a method comprising:

subliming paraxylylene or a derivative cyclic dimer at 30 to 160° C.;

pyrolyzing the resulting product at 800 to 950° C.;

polymerizing the product obtained by pyrolysis at −40 to +25° C.; and heat-treating the resulting polymer.

* * * * *